(12) United States Patent
Whalen

(10) Patent No.: US 6,582,182 B2
(45) Date of Patent: Jun. 24, 2003

(54) SEMICONDUCTOR WAFER STORAGE KIOSK

(75) Inventor: Paul S. Whalen, Monterey, CA (US)

(73) Assignee: Intrabay Automation, Inc., Monterey, CA (US)

( * ) Notice: Subject to any disclaimer, the term of this patent is extended or adjusted under 35 U.S.C. 154(b) by 0 days.

(21) Appl. No.: 09/873,779

(22) Filed: Jun. 4, 2001

(65) Prior Publication Data
US 2002/0182041 A1 Dec. 5, 2002

(51) Int. Cl.[7] ............................................. B65H 49/07
(52) U.S. Cl. ...................... 414/935; 414/940; 414/276
(58) Field of Search .................................. 118/719, 500; 414/935, 940, 273, 274, 276, 277, 281, 282, 283, 278

(56) References Cited

U.S. PATENT DOCUMENTS

| | | | | |
|---|---|---|---|---|
| 5,508,859 A | * | 4/1996 | Hu et al. | 414/276 X |
| 6,000,900 A | * | 12/1999 | Isogai | 414/940 X |
| 6,036,812 A | * | 3/2000 | Williams et al. | 414/283 X |
| 6,050,768 A | * | 4/2000 | Iwasaki et al. | 414/935 X |
| 6,079,927 A | * | 6/2000 | Muka | 414/940 X |

FOREIGN PATENT DOCUMENTS

| | | | | |
|---|---|---|---|---|
| DE | 3417736 | * | 11/1985 | 414/278 |
| JP | 0299107 | * | 12/1989 | 414/278 |
| JP | 405294410 A | * | 11/1993 | 414/940 |

* cited by examiner

Primary Examiner—Christopher P. Ellis
Assistant Examiner—Richard Ridley
(74) Attorney, Agent, or Firm—David O'Reilly

(57) ABSTRACT

A semiconductor wafer cassette storage cabinet or stocker having a retrieval and transfer system constructed in the form of a kiosk encircling a pick-up and transfer apparatus. The structure is formed of a plurality of identical sections having wall panels and roof panels joined together to form a nearly semi-circular enclosure around the pick-up and transfer apparatus. Each section has multiple level input/output ports adjacent to each other with a shelf for supporting a semiconductor wafer cassette. Shelves at the input/output ports are constructed of rails supporting drive rollers and a photodetector to activate the drive rollers to fill an output port whenever a cassette has been retrieved and transferred. One embodiment with five identical sections can store and retrieving up to twenty semiconductor wafer cassettes while an optional embodiment with seven identical sections can store twenty-eight semiconductor wafer cassettes.

8 Claims, 4 Drawing Sheets

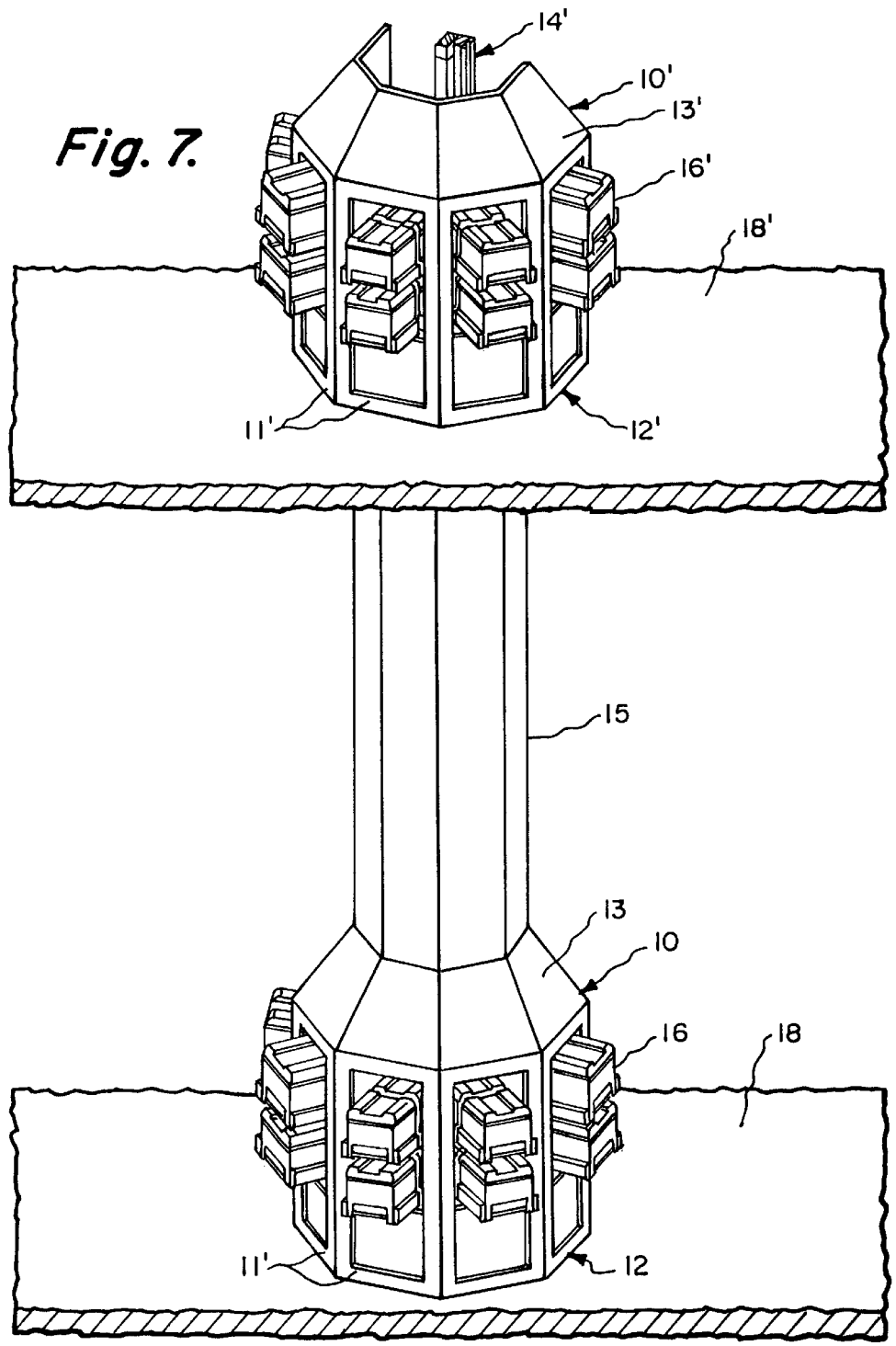

SEMICONDUCTOR WAFER STORAGE KIOSK

BACKGROUND OF THE INVENTION

1. Field of the Invention

This invention relates to semiconductor storage cabinets known as "stockers" and more particularly relates to a semi-open architecture "kiosk" storage cabinet or stocker.

2. Background Information

Semiconductor wafer fabrication involves hundreds of processes for producing electronic chips or integrated circuits such as microprocessors, computer memory and other microcircuits. Throughout the fabrication process, the semiconductor wafers are transported from one processing station or area in sealed containers or cassettes. The semiconductor wafers must be kept in a class 1 substantially contaminant-free environment throughout the fabrication processing.

Between processing steps the sealed containers for the semiconductor wafers are stored in enclosures known as stockers. Each container may have up to seventy-five 300 mm (12 inch) semiconductor wafers. The containers are manually or by an automatic transfer and transport system moved out of the stockers through a port or window to a processing station. After each process is complete, the semiconductor wafers are returned to the container and then usually delivered back to the stocker to await further processing or to another stocker at the next processing step. There may be many stockers strategically placed at intervals along the production line for easy access by personnel performing the processing.

The stockers have a plurality of open frame slots or shelves inside a substantially rectangular enclosure. Semiconductor wafer containers are returned or retrieved through a port or window in the stocker. After a particular process is complete, the semiconductor wafer container is either manually or by an automatic transport system returned to a shelf at the in/out window or port. An automatic pick up and transfer apparatus picks up the semiconductor wafer container and places it in an empty slot or shelf in the stocker to await the next processing step.

The pick up and transfer apparatus is a three-axis robot comprised of a linear arm that moves vertically, rotationally, and horizontally inside the stocker. The robot has a paddle for picking up a container and is driven by several programmed servo motors. Vertical and rotational movement of the linear arm is performed by the programmed servo motors. Another servo motor moves the paddle horizontally in and out into position beneath a container. The system always knows where there is an empty slot or shelf in the stocker. Once a semiconductor wafer container is placed in the input port or window, the pick up and transfer apparatus is triggered automatically or by an operator to move into position vertically and rotationally and moves the paddle horizontally to pickup the container. The paddle with the container is then retracted and the pick up and transfer apparatus quickly moves inside the stocker to a position adjacent an empty slot or shelf. The robot then deposits the container on the shelf and is retracted and the linear arm returned to a standby position to await the next semiconductor wafer container being retrieved or stored. The retrieval of a semiconductor wafer container from the stocker is just a reversal of the process of storing a container described above.

A disadvantage of this type of stocker is the time to retrieve and store semiconductor wafer containers. Since there is usually only one input port or window, the system or operator must wait until pickup and transfer apparatus retrieves and stores a container placed at the input port and then return to retrieve another container. This makes the process of retrieving, storing, and transferring semiconductor wafer containers into or out of the stocker slow and tedious. Since retrieval and transfer of semiconductor wafer containers for delivery to a processing station is an important step in the process, it would be advantageous if the retrieval and transfer can be accelerated and made more efficient.

One object of the present invention is to provide a semi-open architecture for a semiconductor wafer container storage cabinet or stocker.

Another object of the present invention is to provide a semiconductor wafer storage container in which each input port or window is buffered.

It is therefore another object of the present invention to provide a semi-open architecture or kiosk stocker with each interior space buffered with an adjacent exterior space or slot.

Yet another object of the present invention is to provide a semiconductor wafer container kiosk construction that includes automatic detection of the position of each semiconductor wafer container.

Yet another object of the present invention is to provide a semiconductor wafer container kiosk that automatically advances and fills an open slot when a pick-up and transfer device retrieves a semiconductor wafer container.

Another object of the present invention is to provide an improved stocker that permits rapid replacement of multiple containers removed and transferred out of the stocker.

Still another object of the invention is to provide a drive and detection system to detect when a semiconductor wafer has been removed and automatically start a drive system to move a back up container into the empty space where the semiconductor wafer has been removed.

BRIEF DESCRIPTION OF THE INVENTION

The purpose of the present invention is to provide a semiconductor storage cabinet known as a stocker having a semi-open architecture kiosk construction in which each internal storage position in the stocker has an external space acting as a buffer to fill an empty space when a semiconductor wafer is removed from an internal space or slot. The system facilitates the storage and retrieval of semiconductor wafer containers to improve the production of integrated circuit chips from semiconductor wafers.

The stocker of the present invention provides a semiconductor wafer container kiosk that is constructed of multiple identical sections forming approximately a semi-circular cabinet around a pick-up and transfer device. Five to seven sections, each identical form a structure around the pick-up or transfer device. The number of sections depends upon the size of the semiconductor wafer containers being stored for processing. Larger, 300 mm (12" wafers) containers limit the number of sections to five while the smaller, 180 mm (8" wafers) containers allow up to identical seven sections forming the semi-circular kiosk.

Each section of the five section storage kiosk has a vertical panel with two input ports or windows one above the other allowing storage of up to ten semiconductor wafer containers in the kiosk. The shelves for supporting the semiconductor wafer containers extend outside the kiosk so that each storage slot inside the kiosk is "buffered" by a second semiconductor wafer container accessible from outside the kiosk resulting in a doubling the capacity to ten buffered storage spaces or slots for a total storage space of up to twenty containers of the larger wafers or up to twenty-eight containers of the smaller wafers.

Each shelf both inside and outside the kiosk has a drive and detection system for advancing and replacing a semiconductor wafer container automatically upon a removal of a cassette or container by the pick-up and transfer system. The shelves have a pair of side rails joined by cross bars to provide support. Mounted on and between the side rails are a plurality of rollers for supporting a semiconductor wafer container that is positioned in the storage space. A separate shelf having a detector and drive system is provided at each storage space or slot both inside and outside the stocker. A shelf on an exterior position is adjacent to and in alignment with an identically constructed shelf on the interior of the kiosk. The rollers on one side of the shelf are attached to the adjacent side rail and connect to a drive motor inside the side rail. Idler rollers are mounted on the opposite side rail.

A photo-detector responds to indicate a semiconductor wafer container has been picked up and removed. This activates a drive system to move a back-up cassette into the space or slot where the cassette was removed. A photo-detector is provided at a front end of one of the side rails for detecting when a shelf or position is empty or filled with a semiconductor wafer container. Each detector is connected with the system electronics and provides a signal when there is a change at any one of the interior or exterior positions of the stocker. The detectors indicate when there is a change at any one of the positions in the stocker. Thus whenever a semiconductor wafer cassette is picked up and removed by pick-up and transfer device, the detectors in the interior shelf and adjacent exterior shelf tell the system to move the cassette in the buffer position forward filling the empty interior space or slot. The system permits a semiconductor wafer cassette stocker to be re-filled in minutes rather than the much longer times with present stockers.

An advantage of this device and construction is the kiosk stocker can be re-filled quickly as each internal shelf or slot is backed-up or buffered with an external shelf allowing rapid refilling of empty slots. In present stockers replacement of removed containers is agonizingly slow as there is usually only one port to input new containers. As each container is placed on a shelf, adjacent input port the pick-up and transfer system must pick the container up, move to an open space or shelf inside the stocker then return to the input port from another container. In contrast the kiosk stocker allows replacement of ten to fourteen containers in minutes or in almost the same time it takes to replace a single container in the present stockers.

The semiconductor wafer cassette storage system is comprised of a plurality of identical sections forming a semi-open architecture around a pick-up and transfer system for retrieving semiconductor storage containers on shelves in the interior of the stocker. Each identical section of the stocker has a vertical panel with a port or window for mounting two interior shelves and two exterior shelves one above the other. Each exterior shelf backs up an interior shelf. The back up shelves act as a buffer or temporary storage ready to immediately and automatically fill a space and replace a semiconductor wafer container removed from the stocker by pick-up and transfer device.

The above and other objects, advantages, and novel features of the invention will be more fully understood from the following detailed description and the accompanying drawings, in which:

BRIEF DESCRIPTION OF THE DRAWINGS

FIG. 7 is an elevational view of a kiosk stocker of FIG. 1 in a multi-level configuration.

DETAILED DESCRIPTION OF THE INVENTION

Figure 1:
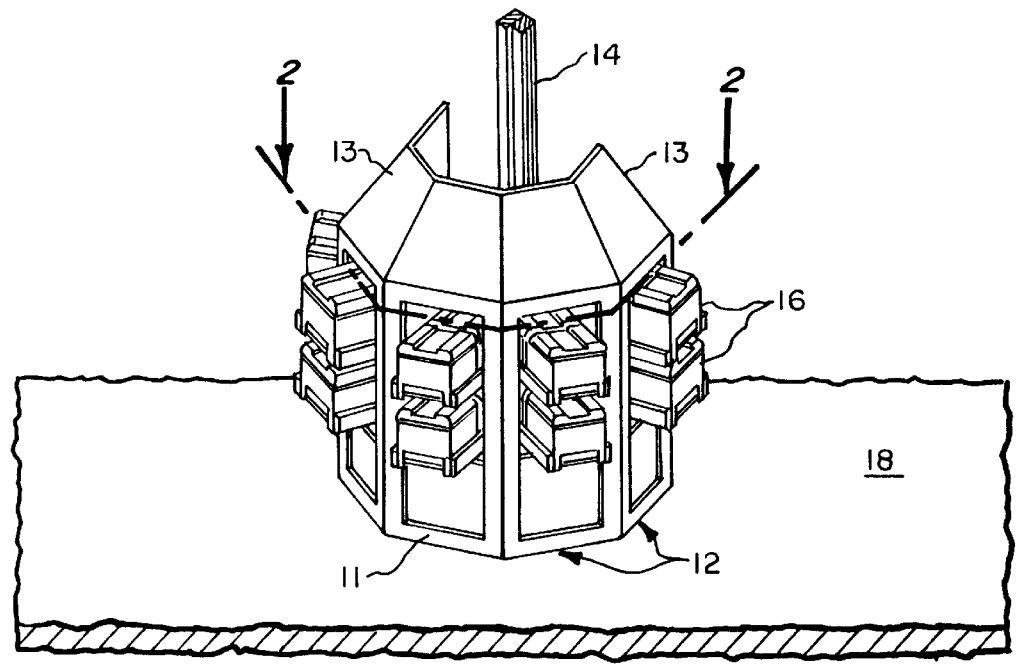
FIG. 1 is an elevational view of a "kiosk" stocker constructed according to the invention.

A "kiosk" stocker 10 having a semi-open architecture is illustrated in FIG. 1. Stocker 10 is a multi-sided structure having five identical sections 12 comprised of vertical panels 11 and angled covering panels or portions 13 that partially encircle a pick-up and transport system for retrieving semiconductor wafer cassettes or containers 16 and deliver them to another location for the next processing step. Stocker 10 rests on a floor in a Class 1 clean room environment. A pumping system integral with pick-up and transport device (not shown), which is the subject of U.S. patent application Ser. No. 09/634,032 filed Aug. 8, 2000 by the same inventor of the invention disclosed herein, maintains a Class one clean room environment around stocker 10.

A unique feature of the invention is the multiple input/output ports to increase the efficiency of storing, retrieving, and delivering semiconductor wafer cassettes or boxes 12 to a processing station.

Figure 6:
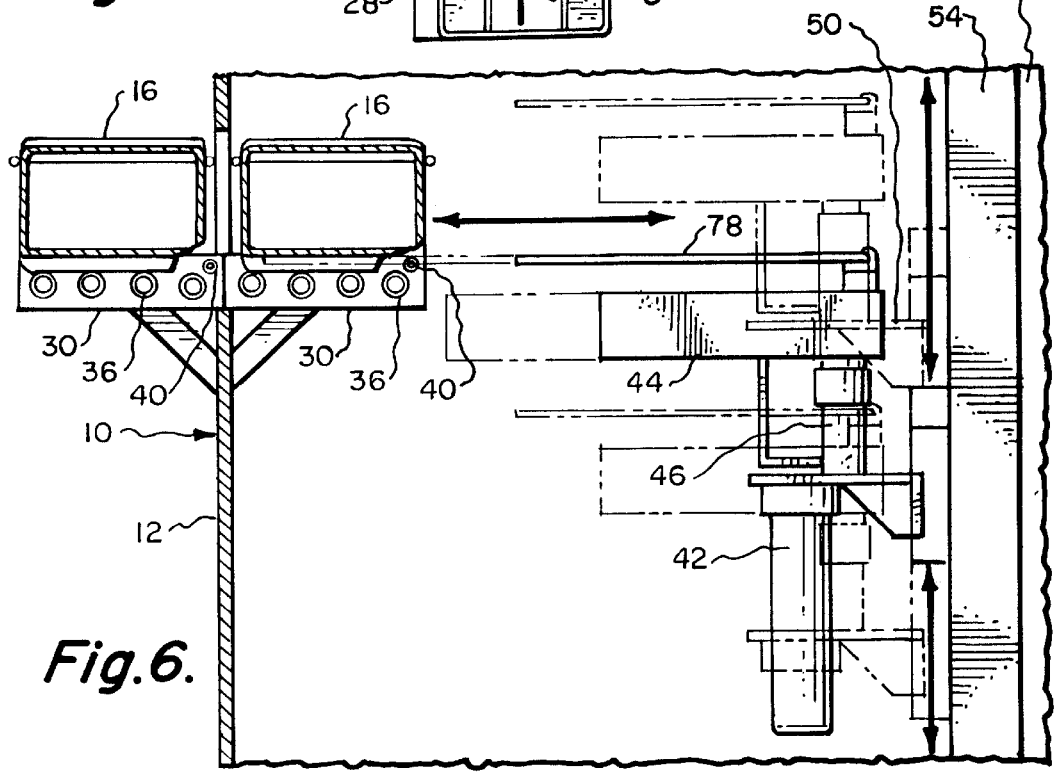
FIG. 6 is a partial sectional view taken at 6—6 of FIG. 2.
Figure 3:
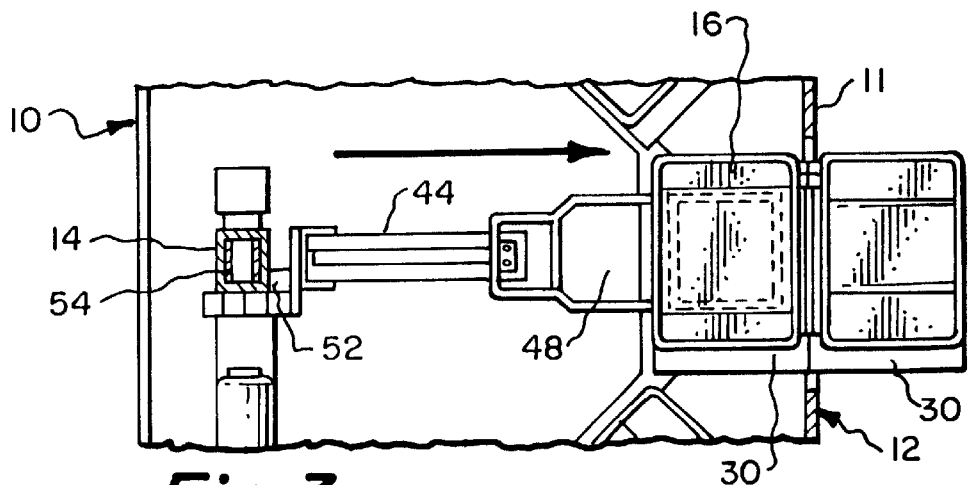

Each section of stocker 10 is identical and has a two level port or window 20 in each vertical panel 11. When five identical sections 12 of stocker 10 are joined, they provide ten interior storage spaces 22 buffered by ten exterior storage spaces 24 for storing up to twenty cassettes as shown in FIG. 3. Each space 22, 24 in kiosk stocker 10 has a shelf 26, 28 for supporting a semiconductor wafer cassette 16. Each shelf 28 is formed of a pair of rails 30, 32 joined by cross bars 34 (FIGS. 5 and 6) and have drive rollers 36 on one side and idler rollers 38 on the other for supporting cassette or box 16. Rail 30 includes an electrical drive system (not shown) for driving rollers 30 on each shelf which are automatically activated as will be described in greater detail hereinafter. Idler rollers 38 are supported by rail 32. Each shelf 22, 24 is identical which reduces cost and make the system more efficient by simplifying replacement.

The system is constructed to facilitate storage, retrieval, and transfer of cassettes 16 by automatically replacing a cassette 16 that is picked up and removed from kiosk stocker 10 by pick-up and transfer system 14 as shown in FIGS. 3 through 6. As described previously, cassettes 16 rest on drive rollers 36 and idler rollers 38 in each shelf 30. Sensor 40 at a forward end of each shelf detects the presence or absence and is activated accordingly. Sensors 40 detect when all ten interior shelves 22 and all exterior shelves 24 are full or any space or shelf is empty. Removal of a cassette 16 from one of the interior spaces 22 by pick-up and transfer device 14 activates the system.

The removal of a cassette 16 and activation of the system is illustrated in FIGS. 3 through 6. Pick-up and transfer device 14 operates on three axis and is driven by three sensor motors only two of which are shown. Sensor motor 42 drives and rotates driver arm 44 while sensor motor 46 drives paddle 48 forward and back to pick up a cassette 16. Linear arm 44, paddle 48, and sensor motor 42 and 46 are mounted on a structure 50 attached to a belt 52 inside channel 54. A third sensor motor (not shown) drives belt 52 to raise and lower linear arm 44 and paddle 48 inside stocker 10.

Figure 5:
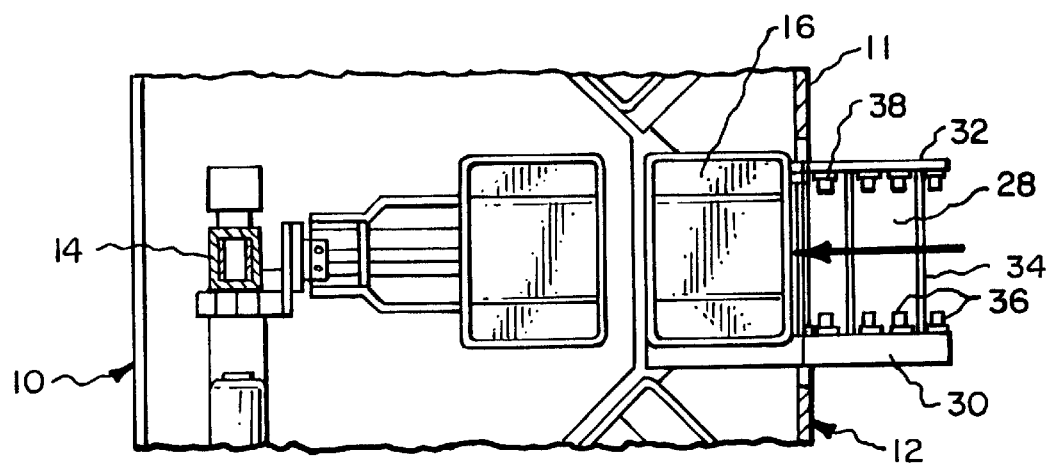
FIGS. 3, 4, and 5 are partial sectional views of the storage shelves illustrating the operation of a pick-up and transfer device and re-filling of an empty slot.
Figure 4:
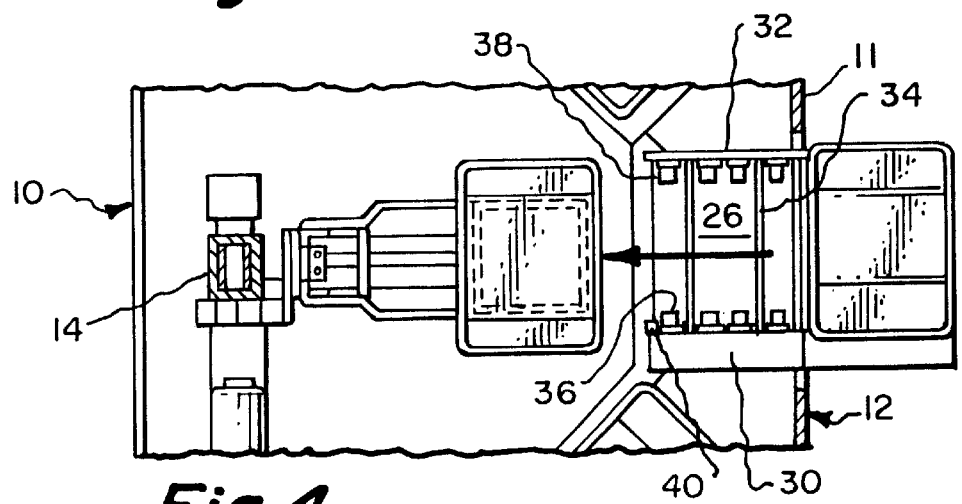

To retrieve a cassette 16 linear arm 44 and paddle 48 are moved vertical very quickly to the proper level by moving belt 52 in channel 54. Sensor motor 42 then rotates linear arm into alignment with cassette 16 while sensor motor 46 advances paddle 48 and lifts the cassette. Paddle 48 is retracted as shown in FIG. 5 and pick-up and transfer device delivers cassette 16 to a transport system (not shown). This leaves an empty shelf 26 in the interior of stocker 10.

Sensor 40 detects that shelf 26 is empty and activates the system to activate drive rollers 36 in the section where cassette 16 was removed. Cassette 16 on shelf 28 (FIG. 5) is advanced until it intercepts and is detected by sensor 40 which stops the drive system. As each interior space 26 is filled by advancing a cassette 16 from the exterior space 28 it can be quickly refilled. Up to ten positions can be refilled in as little time as it takes to refill one position with present stockers with a single input/output port.

As a cassette is removed and transferred, a replacement is manually placed in an input port for retrieval and replacement by a pick-up and transfer device. With the present invention every interior space 26 is buffered by an exterior space 28 which automatically refills any empty interior space.

Another option is to make paddle 48 in the same configuration as shelves 30. In this configuration paddle 40 would be replaced with a pair of rails and drive motors to advance a cassette from a storage shelf 38 onto pickup and transfer mechanism. Sensors will sense when the frame on the pickup and transfer device abuts a storage shelf activating the rollers to advance a cassette 16 on shelf 30 onto the drive rollers on the pickup and transfer device.

The system can also be used in a multi-level environment as shown in FIG. 7. Kiosk stockers 10 are placed on each floor 18, 18' above each other for service by pick-up and transfer device 14' that travels between lower floor 18 and upper floor 18' in shroud 15. The operation of each kiosk stocker 10 on the lower floor 18 and kiosk stocker 10' on upper floor is the same as the kiosk stocker 10 described hereinabove with reference to FIG. 1. Each kiosk 12 and 12' holds up to twenty 300 mm semiconductor wafer cassettes or boxes 16 and 16'. Boxes 16 or 16' are retrieved from either kiosk stocker 10, 10' and placed on an automatic transport system (not shown) for delivery to the next processing station. As a cassette 16, 16' is removed a back-up cassette automatically moves forward to fill the interior space. This leaves the exterior shelves free for rapid refilling.

As with the embodiment of FIG. 1, each kiosk stocker 10, 10' is formed of a plurality of identical sections 12, 12', comprised of vertical panels 11 and 11' cover portions 13, 13' and shroud 15 that encircles pick-up and transfer device 14'. For 300 mm sensor conductor wafer cassettes 16 there are five identical sections each having two ports and four shelves holding a total of twenty boxes with the multi-level system of FIG. 7 servicing forty boxes 16.

Figure 8:
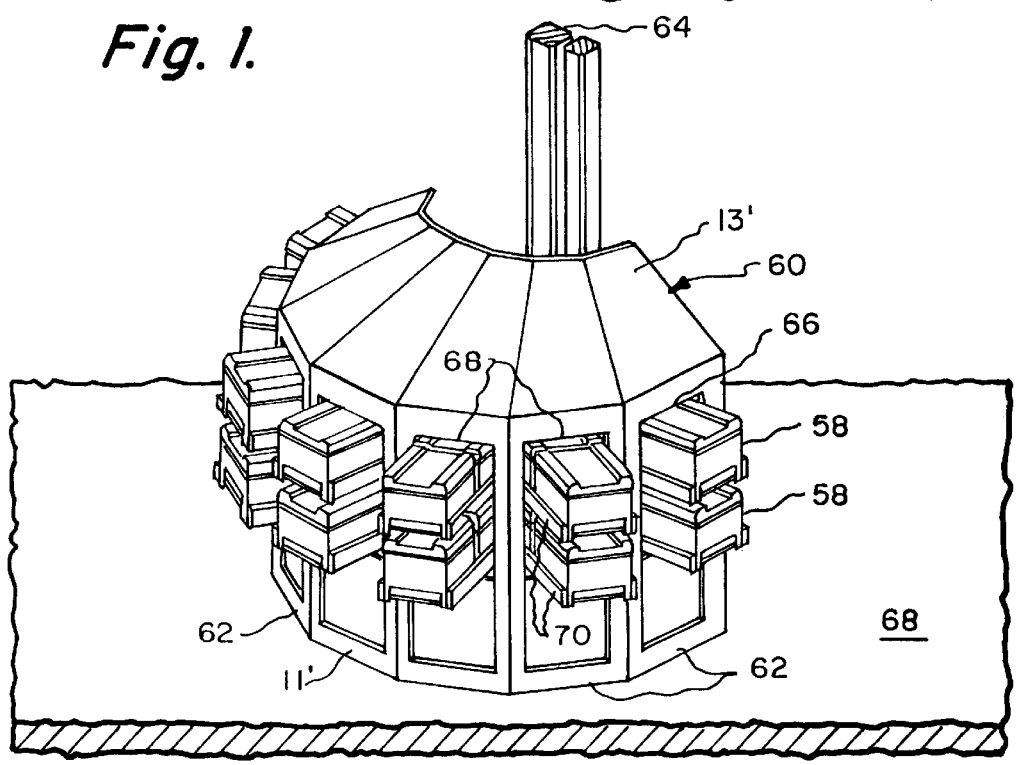
FIG. 8 is an elevational view of another embodiment of the kiosk stocker of FIG. 1.
Figure 2:
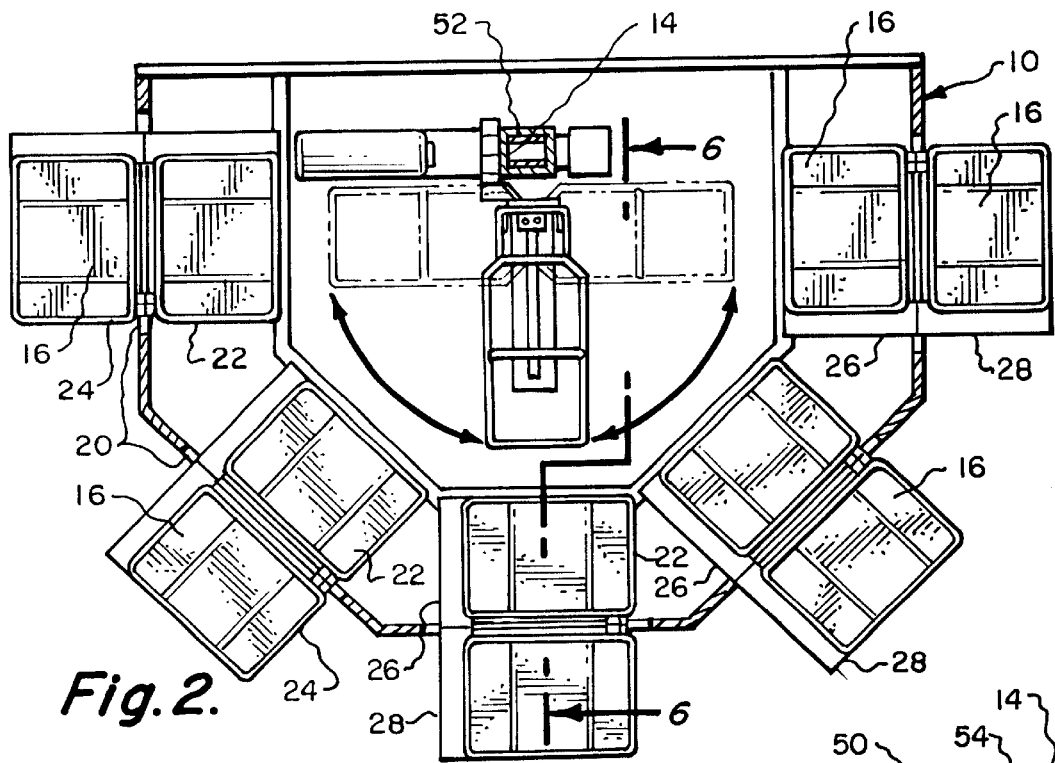
FIG. 2 is a top sectional view of a kiosk stocker taken at 2—2 of FIG. 1.

An optional construction for smaller, 180 mm, semiconductor wafer cassettes 58 is illustrated in FIG. 8. This kiosk stocker 60 rest on a surface or floor 68 and is seven identical sections 62 surrounding pick-up and transfer apparatus 64. Each identical section 62 has a two level port 68 in vertical panels 11 for mounting two exterior and two interior shelves. Thus kiosk stocker 60 can service up to twenty-eight cassettes 16.

The kiosk stocker system of the automatic transport and retrieval system offer flexibility to store 300 mm semiconductor wafer cassettes onto a pre-assigned or first available locations. In each system automatic storage and retrieval is achieved by a pick-up and transfer apparatus of a three axis robot equipped with AC servo drive mechanisms and absolute encoders on each axis. The 300 mm cassettes are loaded onto a shelf or nest position at the input port having a product presence sensor 40 the system automatically executes a store command visible on a touch screen monitor interface (not shown). If an output port adjacent the input port where the box 16 is loaded is empty the command advances cassette 16 to fill the output port leaving the input port shelf or nest position free to receive another box.

The pick-up and transfer robot with a pick-up device and a bar code or tag reader travels to an input/output position. The cassette 16 at that location is scanned and the robot then acquires the cassette and executes a transfer function. The three axis vertical robot sequentially stores, retrieves, and transfer cassettes requested by an operator. Each system has one control panel per elevation and the system intelligent control software executes all retrieve functions first. Cassettes or boxes in input/output positions, staged for storage or transfer, are processed after all requested cassettes have been delivered for transfer by an operator.

This invention is not to be limited by the embodiment shown in the drawings and described in the description which is given by way of example and not of limitation, but only in accordance with the scope of the appended claims.

What is claimed is:

1. A system for storing, retrieving, and transferring semiconductor wafer cassettes comprising;

a storage enclosure formed of a plurality of identical sections, each section comprised of a vertical wall panel and a roof panel;

a window in each vertical wall panel providing an input port;

one or more shelves supporting semiconductor wafer cassettes mounted in said window on the exterior of said vertical wall panels;

one or more shelves supporting semiconductor wafer cassettes mounted in said window on the interior of said vertical wall panels adjacent said one or more shelves mounted on the exterior of said wall panels;

a pickup and transfer apparatus for picking up and transferring a semiconductor wafer cassette stored on said one or more interior shelves;

an automatic drive mechanism on said one or more exterior shelves and one or more adjacent interior shelves for automatically advancing a semiconductor wafer cassette from an exterior shelf to an adjacent interior shelf when said pickup and transfer apparatus removes a semiconductor wafer cassette stored on one of said one or more interior shelves;

whereby said system can efficiently store and retrieve multiple semiconductor wafer cassettes for transfer to processing stations.

2. The system according to claim 1 in which said automatic drive mechanism comprises a detector on said one or more exterior shelves detecting the presence or absence of a semiconductor wafer cassette; a detector on said one or more interior shelves for detecting the presence or absence of a semiconductor wafer cassette;

whereby when said pickup and transfer apparatus retrieves a semiconductor wafer cassette from said one or more interior shelves said automatic drive mechanism automatically advances a semiconductor wafer cassette from said one or more exterior shelves to said one or more interior shelves.

3. The system according to claim 2 in which said one or more interior shelves and one or more adjacent exterior shelves comprise; a pair of parallel rails; supports for supporting said parallel rails; one of said pair of parallel rails having a drive roller supporting a semiconductor wafer cassette; a drive motor mounted on one of said pair of parallel rails for driving said drive roller, said drive motor being connected to said detector for detecting the presence or absence of a semiconductor wafer cassette on said one or more exterior or adjacent interior shelves and activating said drive motor;

whereby said detector activates said drive motor when a semiconductor wafer cassette is picked up and removed from said one or more interior shelves.

4. The system according to claim 3 in which said one or more interior and adjacent exterior shelves comprise two interior and adjacent exterior shelves mounted one above the other in said window in said wall panels.

5. The system according to claim 4 in which said plurality of identical sections forming said storage enclosure comprises five identical sections; said window in each vertical wall panels having two exterior and adjacent interior support shelves; whereby said storage enclosure can support up to twenty cassettes for storage, retrieval, and transfer.

6. A semiconductor wafer cassette storage system comprising a pair of storage enclosures according to claim 5 arranged in a multi-level configuration of one above the other; said pick-up and transfer apparatus extending from said storage structure on a first level to a second storage structure at a second level; whereby said storage, retrieval, and transfer system can service up to forty semiconductor wafer cassettes.

7. The system according to claim 4 in which said plurality of identical sections forming said storage enclosure comprises seven identical sections; said window in each vertical wall panels having two exterior and adjacent interior support shelves; whereby said storage enclosure can support up to twenty-eight cassettes for storage, retrieval, and transfer.

8. A semiconductor wafer cassette storage system comprising; a pair of storage enclosures according to claim 7 arranged in a multi-level configuration of one above the other; said pick-up and transfer apparatus extending from said storage structure on a first level to said second storage structure at a second level; whereby said storage, retrieval, and transfer system can handle up to fifty-six semiconductor wafer containers.

* * * * *